(12) United States Patent
Koo et al.

(10) Patent No.: US 7,847,292 B2
(45) Date of Patent: Dec. 7, 2010

(54) FLAT PANEL DISPLAY

(75) Inventors: Jae-Bon Koo, Suwon-si (KR);
Jae-Kyeong Jeong, Suwon-si (KR);
Hyun-Soo Shin, Suwon-si (KR);
Yeon-Gon Mo, Suwon-si (KR)

(73) Assignee: Samsung Mobile Display Co., Ltd.,
Yongin, Gyunggi-Do (KR)

( * ) Notice: Subject to any disclaimer, the term of this patent is extended or adjusted under 35 U.S.C. 154(b) by 0 days.

(21) Appl. No.: 12/591,548

(22) Filed: Nov. 23, 2009

(65) Prior Publication Data

US 2010/0072478 A1 Mar. 25, 2010

Related U.S. Application Data

(62) Division of application No. 11/439,343, filed on May 24, 2006, now Pat. No. 7,652,291.

(30) Foreign Application Priority Data

May 28, 2005 (KR) ............... 10-2005-0045298
Jun. 23, 2005 (KR) ............... 10-2005-0054369

(51) Int. Cl.
*H01L 27/14* (2006.01)
(52) U.S. Cl. ............ 257/59; 257/72; 257/E27.13; 257/83; 257/E33.064; 313/500; 313/505
(58) Field of Classification Search ............ None
See application file for complete search history.

(56) References Cited

U.S. PATENT DOCUMENTS

| 5,521,729 | A | 5/1996 | Ukai et al. |
| 6,597,413 | B2 | 7/2003 | Kurashina |
| 7,105,855 | B2 | 9/2006 | Winters |
| 2003/0111954 | A1 | 6/2003 | Koo et al. |
| 2003/0127650 | A1 | 7/2003 | Park et al. |
| 2004/0065882 | A1 | 4/2004 | Yamazaki et al. |
| 2004/0115989 | A1 | 6/2004 | Matsueda et al. |
| 2004/0238820 | A1 | 12/2004 | Sakama et al. |
| 2004/0252088 | A1* | 12/2004 | Kawachi et al. ............... 345/76 |

FOREIGN PATENT DOCUMENTS

| EP | 1 349 208 | 10/2003 |
| JP | 2000/353811 | 12/2000 |
| JP | 2001/051292 | 2/2001 |

(Continued)

*Primary Examiner*—Minh-Loan T Tran
*Assistant Examiner*—Fei Fei Yeung Lopez
(74) *Attorney, Agent, or Firm*—Robert E. Bushnell, Esq.

(57) ABSTRACT

A flat panel display that can prevent a voltage drop of a driving power and, at the same time, minimizes the characteristic reduction of electronic devices located in a circuit region where various circuit devices are located includes: a substrate; an insulating film arranged on the substrate; a pixel region including at least one light emitting diode, the pixel region arranged on the insulating film and adapted to display an image; a circuit region arranged on the insulating film and including electronic devices adapted to control signals supplied to the pixel region; and a conductive film interposed between the substrate and the insulating film in a region corresponding to the pixel region and electrically connected to one electrode of the light emitting diode.

13 Claims, 13 Drawing Sheets

FOREIGN PATENT DOCUMENTS

| | | |
|---|---|---|
| JP | 2003/177428 | 6/2003 |
| JP | 2003/303687 | 10/2003 |
| JP | 2004/046154 | 2/2004 |
| JP | 2004/193129 | 7/2004 |
| JP | 2005/070630 | 3/2005 |

\* cited by examiner

FLAT PANEL DISPLAY

CROSS-REFERENCE TO RELATED APPLICATIONS AND CLAIM OF PRIORITY

Under 35 U.S.C. §121, this application is a divisional of Applicants' Ser. No. 11/439,343 filed in the U.S. Patent & Trademark Office on the 24$^{th}$ of May 2006, now U.S. Pat. No. 7,652,291 and assigned to the assignee of the present invention. Furthermore, this application makes reference to, incorporates the same herein, and claims all benefits accruing under 35 U.S.C. §119, §120 and §121 from the two applications both of which are entitled FLAT PANEL DISPLAY DEVICE and earlier filed in the Korean Intellectual Property Office on the 28$^{th}$ of May 2005 and the 23$^{rd}$ of Jun. 2005 and there, duly assigned Ser. Nos. 10-2005-0045298 and 10-2005-0054369, respectively.

BACKGROUND OF THE INVENTION

1. Field of the Invention

The present invention relates to a flat panel display, and more particularly, to a flat panel display that prevents the voltage drop of a driving power and minimizes a reduction of characteristics of electronic devices included in a circuit region where various circuit devices are mounted.

2. Description of the Related Art

A lot of research into manufacturing super slim and flexible flat panel displays, such as Organic Light Emitting Displays (OLEDs) or Thin Film Transistor-Liquid Crystal Displays (TFT-LCDs) in connection with driving characteristics thereof has been conducted.

An Active Matrix (AM) flat panel display includes a pixel circuit in each pixel, and the pixel circuit controls and drives a light emitting device of the pixel according to a signal supplied from a scan line or a data line.

The driving power supplied to each pixel circuit is supplied to pixels by lines. The voltage of the power supplied to each of the pixels is not uniform due to a voltage drop in Vdd lines. As a result, non-uniform brightness can occur resulting in the degradation of the image quality.

Also, in the case of the AM OLED, at least one capacitor is included in each of the pixels, and a voltage drop can occur in the capacitor due to the multiple pixels. This problem to is increased when the screen is large and when there are more capacitors.

To address this problem, a technique of forming an additional power supply layer has been developed by the present inventor.

U.S. Published Patent Application No. 2003/0111954A relates to an organic electroluminescent display having a top emitting structure in which an additional power supply layer supplies power to a substrate. However, in this case, the operation of electronic devices of a scan driver, a data driver, or particularly a Complementary Metal Oxide Semiconductor (CMOS) Thin Film Transistor (TFT) can be interrupted by the power supply layer.

SUMMARY OF THE INVENTION

The present invention provides a flat panel display that prevents a voltage drop of a driving power and improves the characteristics of electronic devices in a circuit region where various circuit devices are mounted and electronic devices included in a pixel region.

According to an aspect of the present invention, a flat panel display is provided including: a substrate; an insulating film arranged on the substrate; a pixel region including at least one light emitting diode, the pixel region being arranged on the insulating film and adapted to display an image; a circuit region arranged on the insulating film and including electronic devices adapted to control signals supplied to the pixel region; and a conductive film interposed between the substrate and the insulating film in a region corresponding to the pixel region and electrically connected to one electrode of the at least one light emitting diode.

According to another aspect of the present invention, a flat panel display is provided including: a substrate including a conductive pattern unit of a conductive material; an insulating film arranged on the substrate; a pixel region including a light emitting diode, the pixel region arranged on the insulating film and adapted to display an image; and a circuit region arranged on the insulating film and including electronic devices adapted to control signals supplied to the pixel region; the conductive pattern unit includes a first pattern unit arranged in a region corresponding to the pixel region and a second pattern unit arranged in a region corresponding to the circuit region.

According to another aspect of the present invention, a flat panel display is provided including: a substrate including first and second pattern units of a conductive material; an insulating film arranged on the substrate; a light emitting diode arranged on the insulating film; a Thin Film Transistor (TFT) arranged on the insulating film and electrically connected to the light emitting diode; and at least one electronic device arranged on the insulating film to correspond to an outer side of the first pattern unit and electrically connected to the TFT; the first pattern unit is electrically connected to the TFT and the second pattern unit is arranged in a region corresponding to the electronic device.

According to another aspect of the present invention, flat panel display is provided including: a substrate including first and second pattern units of a conductive material; an insulating film arranged on the substrate; a light emitting diode arranged on the insulating film; a capacitor unit having at least two capacitors connected in parallel to each other, the capacitor unit arranged on the insulating film and electrically connected to the light emitting diode; and at least one electronic device arranged on the insulating film corresponding to an outer side of to the first pattern unit and electrically connected to the capacitor unit; the first pattern unit is an electrode of the capacitor unit and wherein the second pattern unit is arranged in a region corresponding to the at least one electronic device.

BRIEF DESCRIPTION OF THE DRAWINGS

A more complete appreciation of the present invention and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

The present invention is described more fully below with reference to the accompanying drawings in which exemplary embodiments of the present invention are shown.

Figure 1:
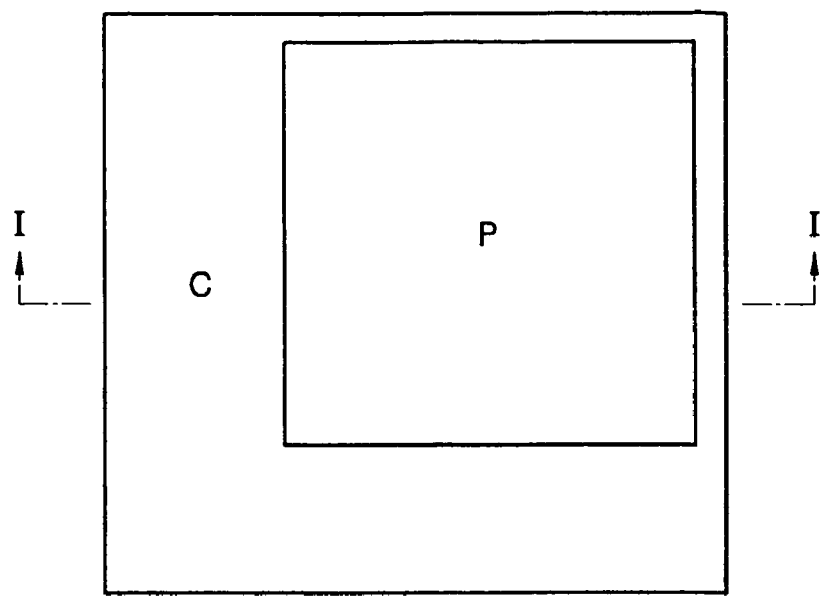
FIG. 1 is a plan view of an Active Matrix (AM) Organic Light Emitting Display (OLED) of a flat panel display according to an embodiment of the present invention.

FIG. 1 is a plan view of an Active Matrix (AM) Organic Light Emitting Display (OLED) of a flat panel display according to an embodiment of the present invention. Referring to FIG. 1, the OLED includes a pixel region P and a circuit region C located on edges of the pixel region P.

The pixel region P includes a plurality of pixels, and each pixel includes an organic light emitting device such as an organic Light Emitting Diode (LED). In a full color OLED, red R, green G, and blue B color pixels are arranged in various patterns, such as a line shape, a mosaic shape, or a lattice shape, and the OLED can be a mono color flat panel display.

The circuit region C includes electronic devices that control the organic LEDs located in pixels of the pixel region P, and circuits in the circuit region C control image signals inputted to the pixel region P and supply power to the electronic devices.

The pixel region P and the circuit region C of FIG. 1 can be realized in a schematic circuit diagram.

Figure 2:
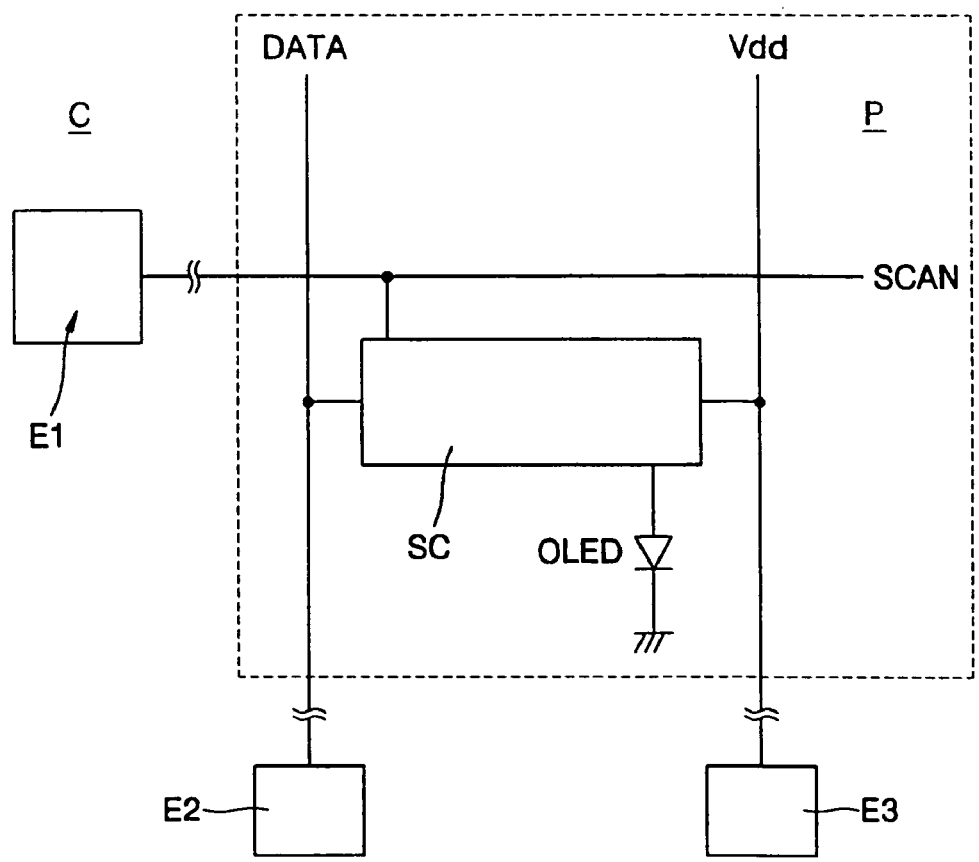
FIG. 2 is a schematic diagram of a pixel region of the AM OLED of FIG. 1 according to an embodiment of the present invention.
Figure 3:
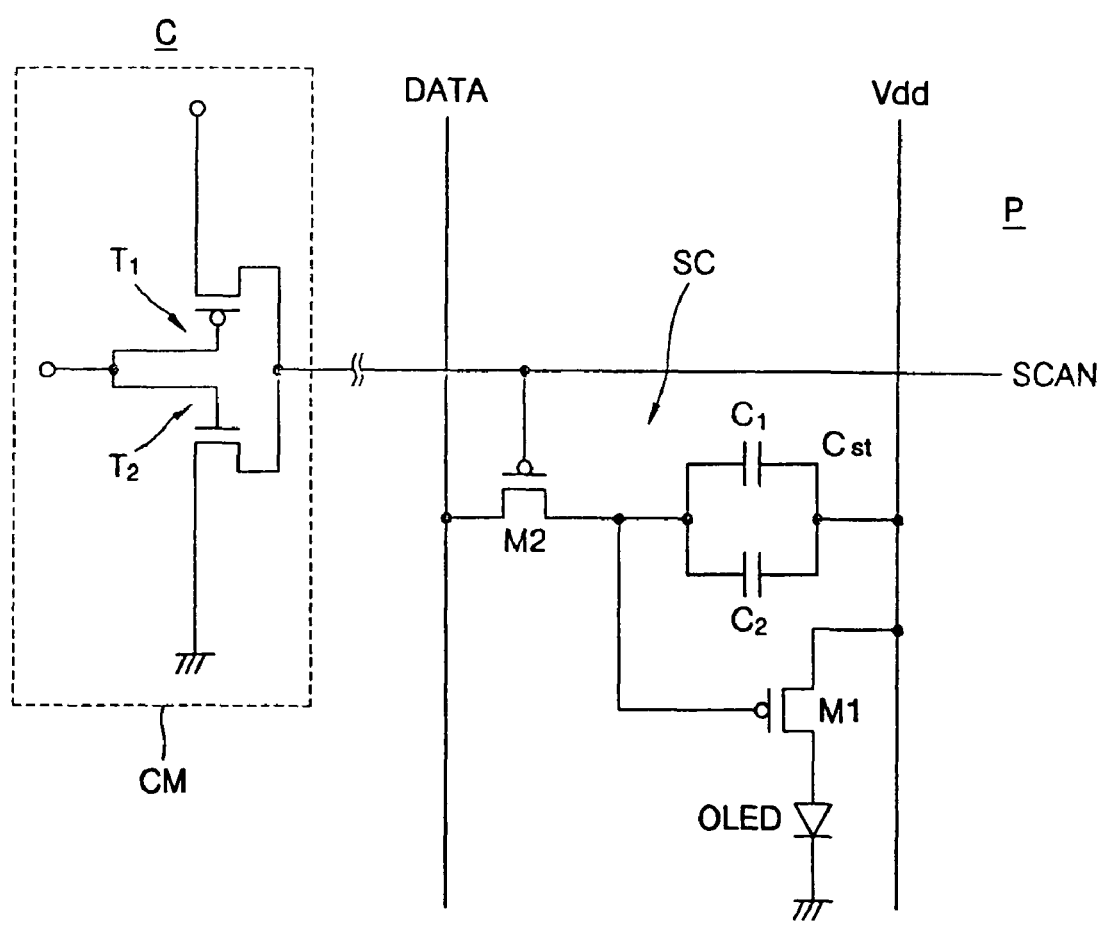
FIG. 3 is a detailed schematic circuit diagram of a pixel circuit of one unit pixel in the pixel region of FIG. 2 according to an embodiment of the present invention.

FIG. 2 is a schematic diagram of one unit pixel in the pixel region P and electronic devices E1, E2, and E3 in the circuit region C connected to the pixel region according to an embodiment of the present invention, and FIG. 3 is a detailed circuit diagram of a pixel circuit. SC in the pixel region P according to an embodiment of the present invention.

Referring to FIG. 2, the pixel includes a power line Vdd which is a source of driving power of an organic LED, a data line, and a scan line.

The pixel circuit SC in each pixel is electrically connected to the data line, scan line, and the Vdd power line Vdd and controls the emission of light of the organic LED.

The circuit region C can include the first electronic device E1 electrically connected to the scan line, the second electronic device E2 electrically connected to the data line, and the third electronic device E3 electrically connected to the Vdd power line Vdd. The first electronic device E1 can be a scan driver, the second electronic device E2 can be a data driver, and the third electronic device E3 can be a Vdd power source. The electronic devices E1, E2, and E3 can be realized by printing on a substrate like the pixel circuit SC or mounting an additional device on the substrate, or can be connected to the pixel circuit SC through a connection medium such as a cable, or a flexible printed circuit board.

Also, the circuit region C can further include various electronic devices for displaying an image in the pixel region P by controlling the emission of light of an organic LED, and include terminal pads connected to external circuits.

In FIG. 3, the pixel circuit SC includes two Thin Film Transistors (TFTs) M1 and M2 and one capacitor Cst, and the circuit region C includes a Complementary Metal Oxide Semiconductor (CMOS) device CM connected to a scan line.

Referring to FIG. 3, the pixel circuit SC of the AM OLED according to the current embodiment of the present invention includes at least two TFTs, i.e., a switching TFT M2 and a driving TFT M1, a capacitor Cst, and an organic LED.

The switching TFT M2 is turned on or off by a scan signal supplied to a scan line to transmit a data signal supplied to a data line to the storage capacitor Cst and the driving TFT M1. The switching TFT M2 according to the current embodiment of the present invention is not limited thereto, but rather can include a switching circuit having a plurality of TFTs and capacitors or can further include a circuit that compensates for a Vth of the driving TFT M1 or a circuit that compensates for a voltage drop of the power line Vdd.

The driving TFT M1 determines the amount of current inputted to the organic LED according to a data signal transmitted through the switching TFT M2.

The capacitor unit Cst stores the data signal transmitted through the switching TFT M2 for one frame time. As depicted in FIG. 3, the capacitor unit Cst according to this embodiment of the present invention can include two capacitors, i.e., a first capacitor C1 and a second capacitor C2.

In the circuit diagram of FIG. 3, the driving TFT M 1 and the switching TFT M2 are depicted as P-type Metal Oxide Semiconductor (PMOS) TFTs, but the present invention is not limited thereto. At least one of the driving TFT M1 and the switching TFT M2 can be an N-type Metal Oxide Semiconductor (NMOS) TFT. Also, the number of TFTs and capacitors are not limited to the current embodiment, but can be varied as necessary.

The CMOS device CM illustrated in FIG. 3 has a coupled structure of a P type TFT T1 and an N type TFT T2. The scan driver does not necessarily include only the CMOS device CM, but can form a driver circuit in connection with various kinds of TFTs and circuit devices.

Figure 4:
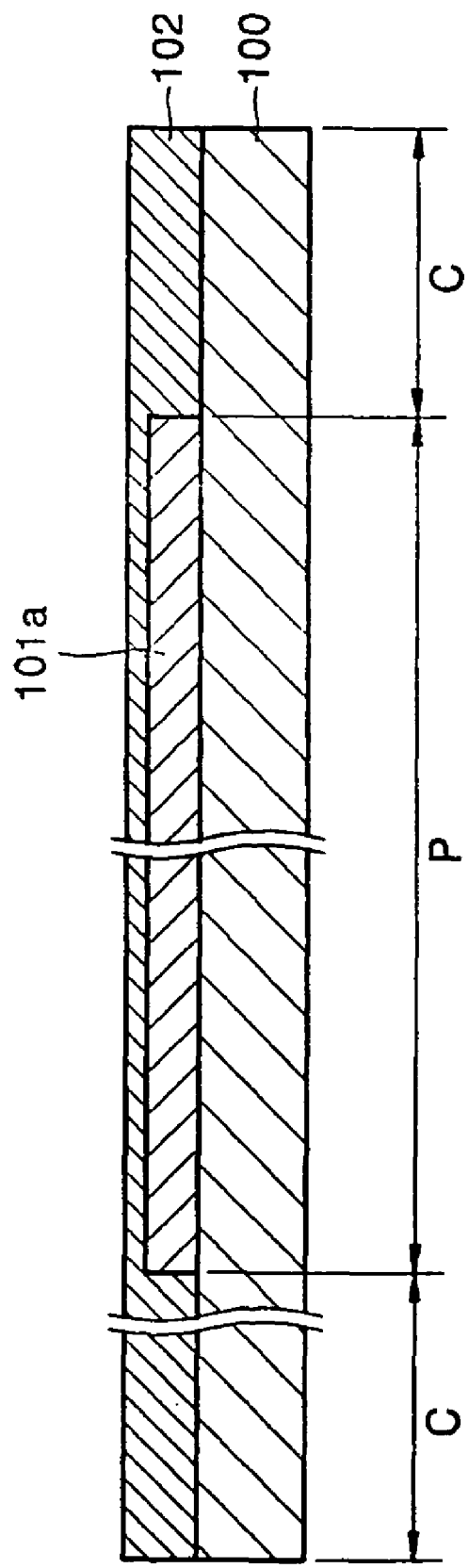
FIG. 4 is a cross-sectional view of a substrate taken along a line I-I of FIG. 1 according to an embodiment of the present invention.

In the present invention, the pixel region P and the circuit region C can be realized on a substrate depicted in FIG. 4. FIG. 4 is a cross-sectional view of a substrate 100 taken along a line I-I of FIG. 1.

Referring to FIG. 4, a first pattern unit 101a is formed on the substrate 100, and an insulating film 102 is formed to cover the first pattern unit 101a.

The substrate 100 can be an insulating substrate formed of glass or plastic. The substrate 100 is not limited thereto, and can also be a conductive metal substrate. In this case, the entire substrate 100 is electrically connected to the first pattern unit 101a, and an effect of the present invention, which will be described later, can be obtained by forming the thickness of the insulating film 102 on an upper part of the first pattern unit 101a differently from the thickness of the insulating film 102 on an upper part of the substrate 100. Hereinafter, however, the substrate 100 is an insulating substrate, and when the substrate 100 refers to a conductive substrate, additional comments will be added.

The first pattern unit 101a can be formed of any conductive material. For example, a metal such as Al, Mo, Ag, Mg, W, Fe, Cr, Ni, Mn, etc. can be used to form the first pattern unit 101a.

As depicted in FIG. 4, the first pattern unit 101a is located in a region corresponding to the pixel region P, and is arranged not to be located in a region corresponding to the circuit region C.

The insulating film 102 can be a single structure or a multi-layer structure of an organic insulating film, an inorganic insulating film, or an organic-inorganic hybrid film. The organic insulating film can be formed of a polymer, for example, a versatile polymeric material such as PMMA or PS, a polymer derivative having a phenol group, acrylic polymer, imide group polymer, arylether group polymer, amide group polymer, fluorine group polymer, p-xylyrene group polymer, vinyl alcohol group polymer, and a blend of these materials. The inorganic insulating film can be formed of $SiO_2$, SiNx, SiON, $Al_2O_3$, $TiO_2$, $Ta_2O_5$, $HfO_2$, $ZrO_2$, BST, PZT, etc. As depicted in FIG. 4, the insulating film 102 can have a planarized surface.

Figure 5:
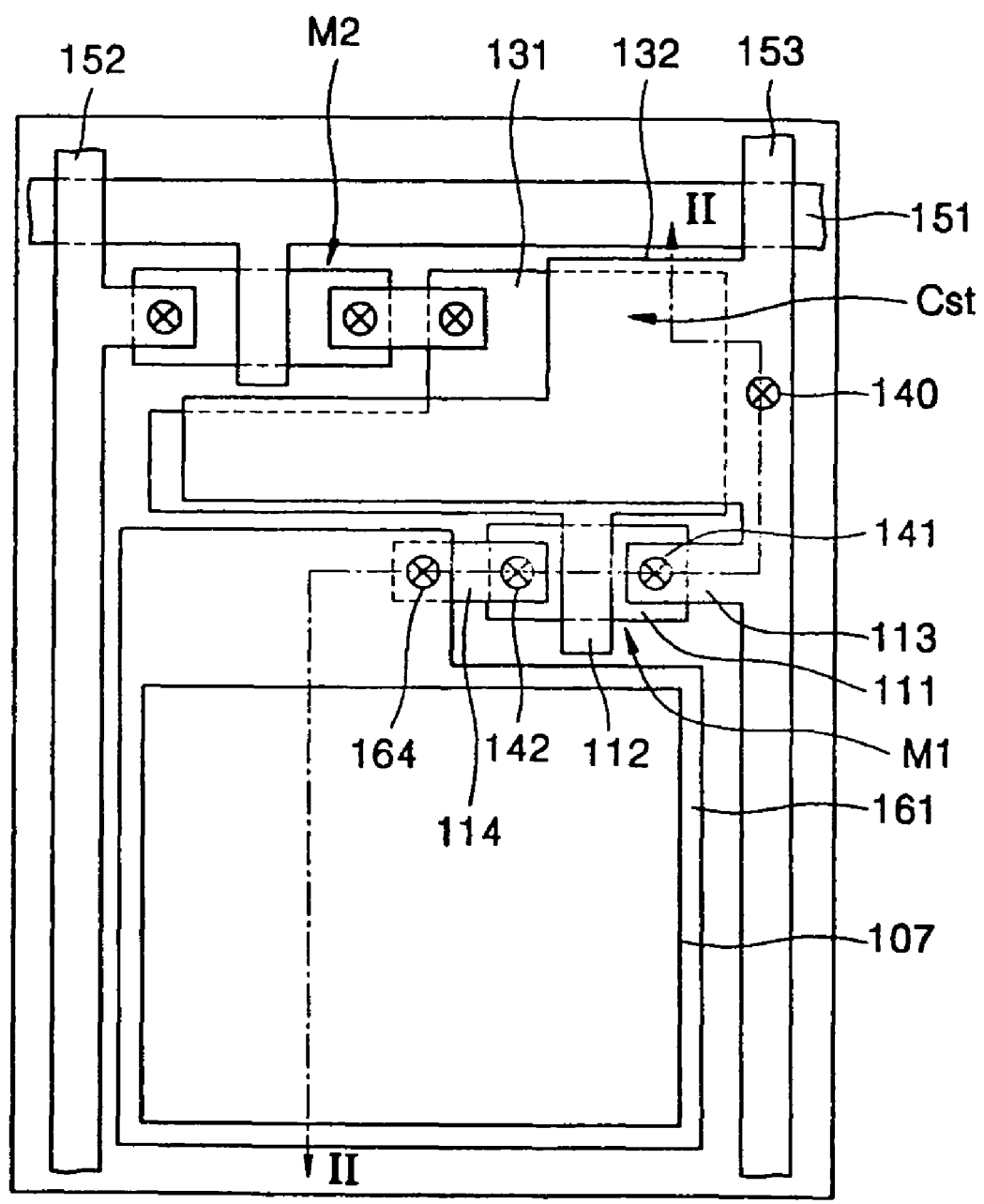
FIG. 5 is a plan view of a layout of a pixel structure to realize the circuit of FIG. 3 according to an embodiment of the present invention.
Figure 6:
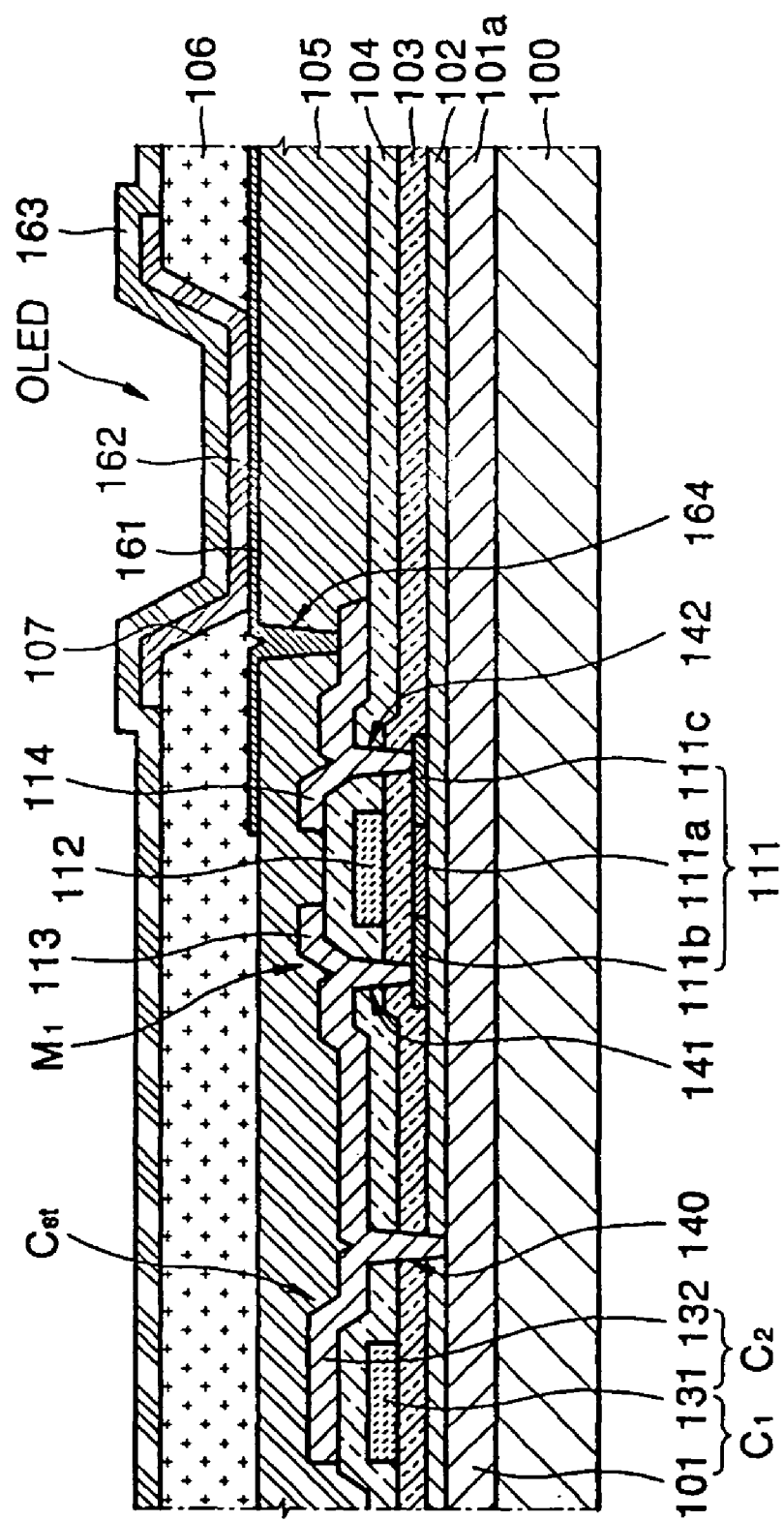
FIG. 6 is a cross-sectional view taken along a line II-II of FIG. 5.

FIG. 5 is a plan view of a layout of a pixel structure that can realize the circuit of FIG. 3 according to an embodiment of the present invention, and FIG. 6 is a cross-sectional view taken along a line II-II of FIG. 5.

Referring to FIG. 5, each pixel is arranged crossing a scan line 151, a data line 152, and a Vdd power line 153.

As described above, each pixel includes a switching TFT M2, a capacitor unit Cst, a driving TFT M1, and an organic LED having a pixel electrode 161.

In the current embodiment of the present invention, a second electrode 132 of the capacitor unit Cst is electrically connected to the first pattern unit 101a via a first through hole 140. Accordingly, a voltage drop of the capacitor unit Cst is prevented, and at the same time, a voltage drop of the Vdd power line 153 is prevented.

The structure of the pixel circuit according to the current embodiment of the present invention is described in detail as follows with reference to FIG. 6. FIG. 6 is a cross-sectional view of the driving TFT M1, the optical LED, and the capacitor unit Cst of the circuit diagram of FIG. 3.

In FIG. 6, only the driving TFT M1 is depicted. However, when a switching device S1 includes a TFT, the TFT can be formed when the driving TFT M1 is formed. Therefore, hereinafter, the driving TFT M1 will be mainly described.

As described above, the first pattern unit 101a is formed on the substrate 100, and the insulating film 102 covering the first pattern unit 101a is formed. A TFT, a capacitor unit Cst, etc., are formed on the insulating film 102.

A semiconductor layer 111 of the TFT is formed on the insulating film 102. The semiconductor layer 111 can be formed of an inorganic semiconductor or an organic semiconductor.

The inorganic semiconductor can include CdS, GaS, ZnS, CdSe, CaSe, ZnSe, CdTe, SiC, or Si. After amorphous silicon is formed on the insulating film 102, the amorphous silicon is transformed into polysilicon through a crystalline process, and then the semiconductor layer 111 is formed by patterning the polysilicon. The amorphous silicon can be crystallized using various crystallization methods including Solid Phase Crystallization (SPC), laser crystallization, Sequential Lateral Solidification (SLS), or metal Induced lateral crystallization.

The organic semiconductor material includes pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivatives, naphthalene tetracarboxylic dianhydride and its derivatives, oligoacen of naphthalene and its derivatives, alpha-5-thiophene oligothiophene and its derivatives, phthalocianin that does not include a metal and its derivatives, phyromeliticdianhydride and its derivatives, phyromelitic diimid and its derivatives, conjugated polymer that includes thiophene and its derivatives, and a polymer that includes fluorine and its derivatives.

The semiconductor layer 111 can be divided into a source region 111b and a drain region 111c on both sides of a channel region 111a. The source and drain regions 111b and 111c can be reversed according to the TFT-type.

After the semiconductor layer 111 is formed, a gate insulating film 103 covering the semiconductor layer 111 is formed, and a gate electrode 112 is formed on a region of the gate insulating film 103 corresponding to the channel region 111a. When the gate electrode 112 is formed, a first electrode 131 of the capacitor unit Cst is formed. The gate electrode 112 and the first electrode 131 of the capacitor unit Cst can be formed of a material that includes a metal such as Ag, Mg, Al, Pt, Pd, Au, Ni, Nd, Ir, Cr, Li, Ca, or a compound of these metals, or a transparent conductive material such as ITO, IZO, ZnO, or $In_2O_3$. Also, the gate electrode 112 and the first electrode 131 can be formed of a conductive organic material or a conductive paste that includes conductive particles of a metal such as Ag, Mg, or Cu, and can be formed in a single layer structure or a multiple layer structure.

An inter-insulating film 104 is then formed to cover the gate electrode 112 and the first electrode 131.

Contact holes 141 and 142 passing through the inter-insulating film 104 and the gate insulating film 103 are then formed, and source and drain electrodes 113 and 114 are formed on the inter-insulating film 104. The source and drain electrodes 113 and 114 respectively contact the source and drain regions 111b and 111c of the semiconductor layer 111 via the contact holes 141 and 142.

The source and drain electrodes 113 and 114 can also be formed of a material that includes a metal such as Ag, Mg, Al, Pt, Pd, Au, Ni, Nd, Ir, Cr, Li, Ca, or a compound of these metals, or a transparent conductive material such as ITO, IZO, ZnO, or $In_2O_3$. Also, the source and drain electrodes 113 and 114 can be formed of a conductive organic material or a conductive paste that includes conductive particles of a metal such as Ag, Mg, or Cu, and can be formed in a single layer structure or a multiple layer structure.

A second electrode 132 of the capacitor unit Cst is formed on the inter-insulating film 104 at the same time as the source and drain electrodes 113 and 114. The first through hole 140 is formed in the inter-insulating film 104, the gate insulating film 103, and the insulating film 102 so that the second electrode 132 of the capacitor unit Cst formed on the inter-insulating film 104 can connect the first pattern unit 101a.

The structure of the TFT, as depicted in FIG. 6, according to the current embodiment of the present invention is not limited thereto, and can have various TFT structures such as a bottom gate structure.

After the TFT and the capacitor unit Cst are formed, a planarizing film 105 covering the TFT and the capacitor unit Cst is formed. A via hole 164 is formed in the planarizing film 105, and a pixel electrode 161 of an OLED is formed on the planarizing film 105. As a result, the pixel electrode 161 is connected to the drain electrode 114 of the driving TFT M1.

An opening 107 for exposing a predetermined portion of the pixel electrode 161 is formed in the pixel defining film 106 after a pixel defining film 106 covering the planarizing film 105 and the pixel electrode 161 has been formed.

The gate insulating film 103, the inter-insulating film 104, the planarizing film 105, and the pixel defining film 106 can also be an organic insulating film, an inorganic insulating film, or an organic-inorganic hybrid film, and can be formed to a single layer structure or a multiple layer structure. The organic insulating film can be formed of a polymer, for example, a versatile polymeric material such as PMMA or PS, a polymer derivative having a phenol group, acrylic polymer, imide group polymer, arylether group polymer, amide group polymer, fluorine group polymer, p-xylene group polymer, vinyl alcohol group polymer, and a blend of these materials. The inorganic insulating film can be formed of $SiO_2$, $SiN_x$, $SiON$, $Al_2O_3$, $TiO_2$, $Ta_2O_5$, $HfO_2$, $ZrO_2$, BST, PZT, etc.

An organic light emitting layer 162 and a facing electrode 163 are sequentially formed on the pixel electrode 161 exposed through the opening 107 in the pixel defining film 106.

The pixel electrode 161 can function as an anode electrode, and the facing electrode 163 can function as a cathode electrode. The pixel electrode 161 can be patterned to a size corresponding to each of the pixels, and the facing electrode 163 can be formed to cover all of the pixels.

The organic LED can be a top emission type since the first pattern unit 101a is formed on the substrate 100. In this case, the pixel electrode 161 can be used as a reflection electrode. When the pixel electrode 161 is used as the reflection electrode, the pixel electrode 161 can be formed of ITO, IZO, ZnO or $In_2O_3$ on a reflection film after the reflection film is formed using Ag, Mg, Al, Pt, Pd, Au, Ni, Nd, Ir, Cr, or a compound of these metals. The facing electrode 163 can be a transparent electrode. When the facing electrode 163 is used as the transparent electrode, the facing electrode 163 can be formed such that after depositing a thin film formed of a metal having a low work function, such as Li, Ca, LiF/Ca, LiF/Al, Al, Ag, Mg, or a compound of these metals facing the organic light emitting layer 162, an auxiliary electrode layer or a bus electrode line formed of a material for forming the transparent electrode, such as ITO, IZO, ZnO or In2O3, can be formed on the material layer. When the second electrode layer 34 is used as the reflection electrode, the second electrode layer 34 is formed by depositing Li, Ca, LiF/Ca, LiF/Al, Al, Ag, Mg, or a compound of these metals.

Materials for forming the pixel electrode 161 and the facing electrode 163 are not limited thereto, and can be conductive organic materials or conductive pastes.

The organic light emitting layer 162 can be a low molecular weight organic layer or a polymer organic layer. When the organic light emitting layer 162 is a low molecular weight organic film, the organic light emitting layer 162 may be a Hole Injection Layer (HIL), a Hole Transport Layer (HTL), an EMission Layer (EML), an Electron Transport Layer (ETL), an Electron Injection Layer (EIL) or a combination of these layers and can be composed of copper phthalocyanine (CuPc), N,N'-Di(naphthalene-1-yl)-N,N'-diphenyl-benzidine (NPB), or tris-8-hydroxyquinoline aluminum (Alq3). The low molecular weight organic film can be formed using an evaporation method.

When the organic light emitting layer 162 is a polymer organic film, the organic light emitting layer 162 can be an HTL and an EML. The HTL can be formed of poly-(2,4)-ethylene-dihydroxy thiophene (PEDOT) and the EML can be formed of Poly-Phenylenevinylene (PPV), Soluble PPV's, Cyano-PPV, or Polyfluorene and can be formed using a screen printing process or an inkjet printing process.

An upper part of the organic LED is sealed from external air after being formed.

According to an embodiment of the present invention, a first capacitor C1 includes the first pattern unit 101a, the insulating film 102, the gate insulating film 103, and the first electrode 131, and a second capacitor C2 includes the first electrode 131, the inter-insulating film 104, and the second electrode 132. The second electrode 132 is connected to the first pattern unit 101a so that the first capacitor C1 and the second capacitor C2 can be connected in parallel with each other. Also, as depicted in FIG. 5, the source electrode 113 is connected to the second electrode 132 of the capacitor unit Cst so that the driving TFT M1 and the capacitor unit Cst can be electrically connected to each other. Also, the Vdd power line 153 formed when the source and drain electrodes 113 and 114 are formed, is connected to the source electrode 113 and the first pattern unit 101a, and realizes the same circuit as depicted in FIG. 3.

In this way, the first pattern unit 101a according to an embodiment of the present invention is used as an electrode of the capacitor unit Cst, thereby preventing a voltage drop of the capacitor unit Cst, and the first pattern unit 101a can also prevent the voltage drop of the Vdd power line 153 since the first pattern unit 101a is electrically connected to the Vdd power line 153.

As described above, the capacitor structure according to the present invention can be applied to various structures.

Figure 7:
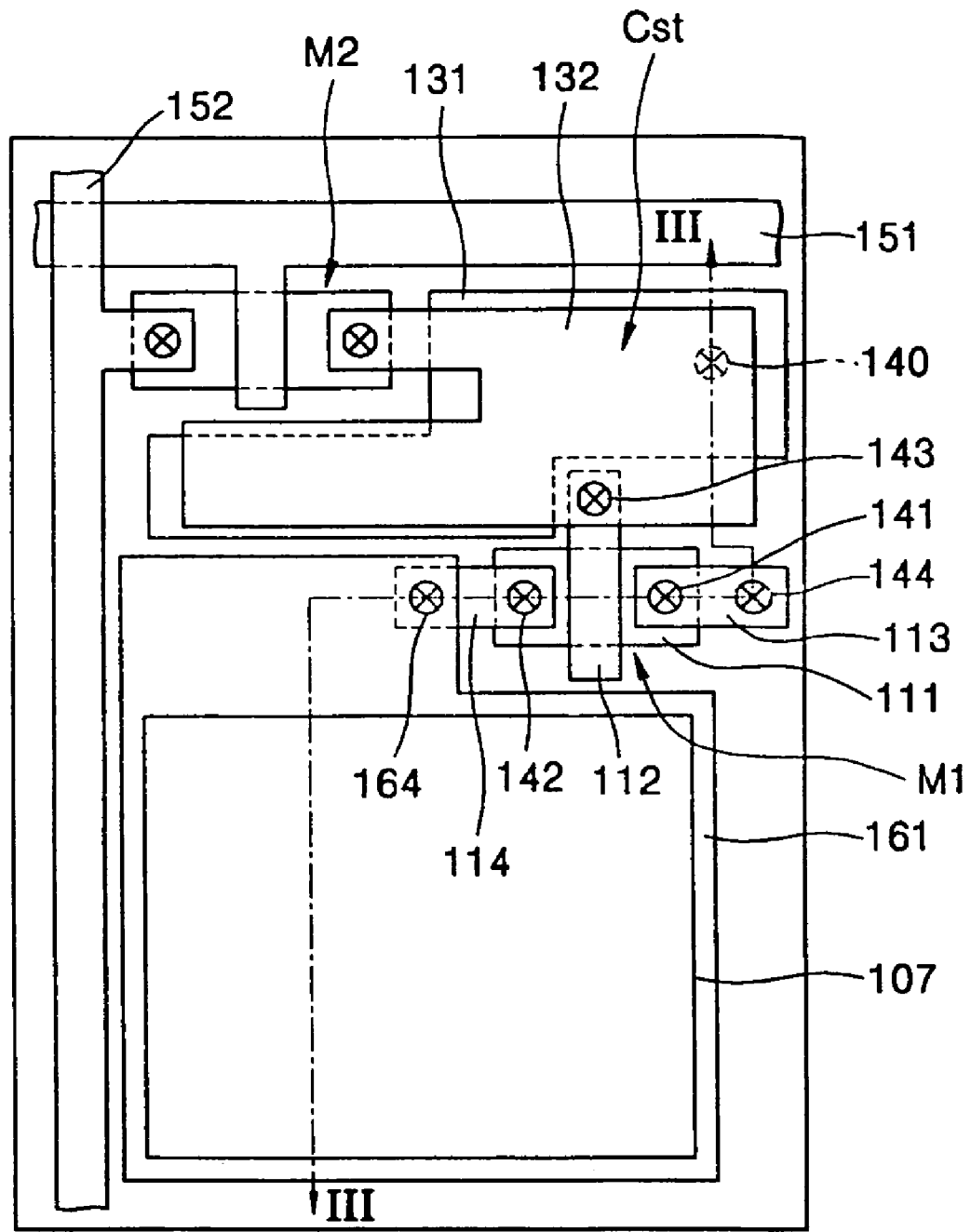
FIG. 7 is a plan view of a layout of a pixel structure to realize the circuit of FIG. 3 according to another embodiment of the present invention.
Figure 8:
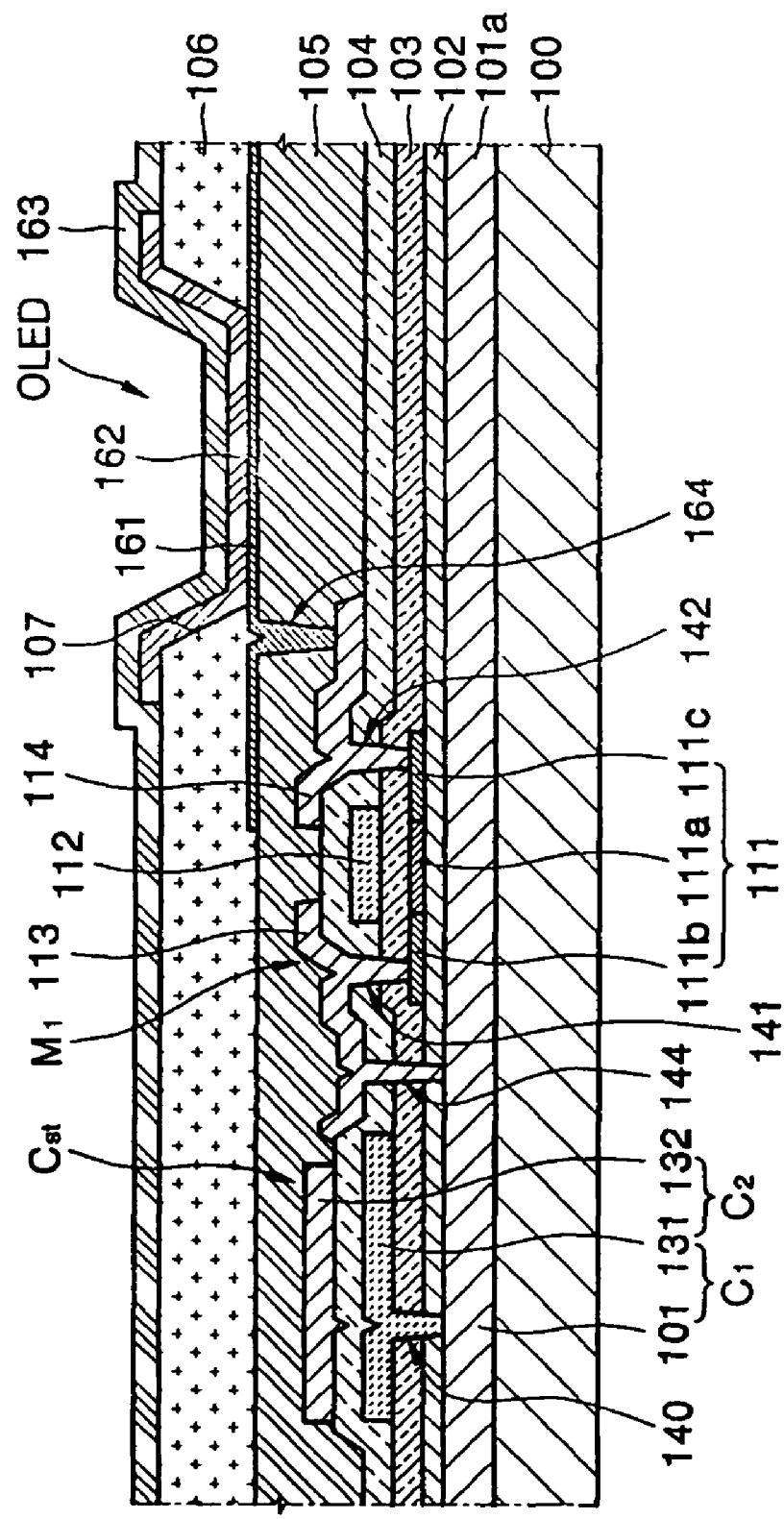
FIG. 8 is a cross-sectional view taken along a line of FIG. 7.

FIG. 7 is a plan view of a pixel of an OLED according to another embodiment of the present invention, and FIG. 8 is a cross-sectional view taken along a line of FIG. 7.

The basic structure of the pixel of an OLED depicted in FIGS. 7 and 8 is substantially the same as that of FIGS. 5 and 6. Thus, a detailed description thereof has been omitted, but the main differences will be described.

Referring to FIG. 7, the OLED according to the current embodiment of the present invention does not include an additional Vdd power line, and as depicted in FIG. 8, a first pattern unit 101a functions as the Vdd power line. That is, a driving power which is supplied to an existing Vdd line is also supplied to the first pattern unit 101a. Accordingly, only a scan line 151 and a data line 152 pass through each pixel, thereby enabling a compact structure. Also, the risk of electrical disconnection between the Vdd line and an adjacent pixel can be removed.

A second electrode 132 of a capacitor unit Cst is connected to the drain electrode of a switching TFT M2 as one body, and is connected to a gate electrode 112 of a driving TFT M1 via a contact hole 143 (see FIG. 7). As depicted in FIGS. 7 and 8, a first electrode 131 of the capacitor unit Cst is electrically connected to the first pattern unit 101a, to which the Vdd power is supplied, via a first through hole 140.

Also, a source electrode 113 of the driving TFT M1 is connected to the first pattern unit 101a via a second through hole 144. Other structures in FIGS. 7 and 8 are the same as those in FIGS. 5 and 6.

In the current embodiment of the present invention, the voltage drop of the capacitor unit Cst can be prevented since the first electrode 131 of the capacitor unit Cst, formed at the same time as the gate electrode 112, is electrically connected to the first pattern unit 101a, and also, the voltage drop of the Vdd power line can be prevented since the Vdd line that supplies a Vdd power does not pass the pixels.

Figure 9:
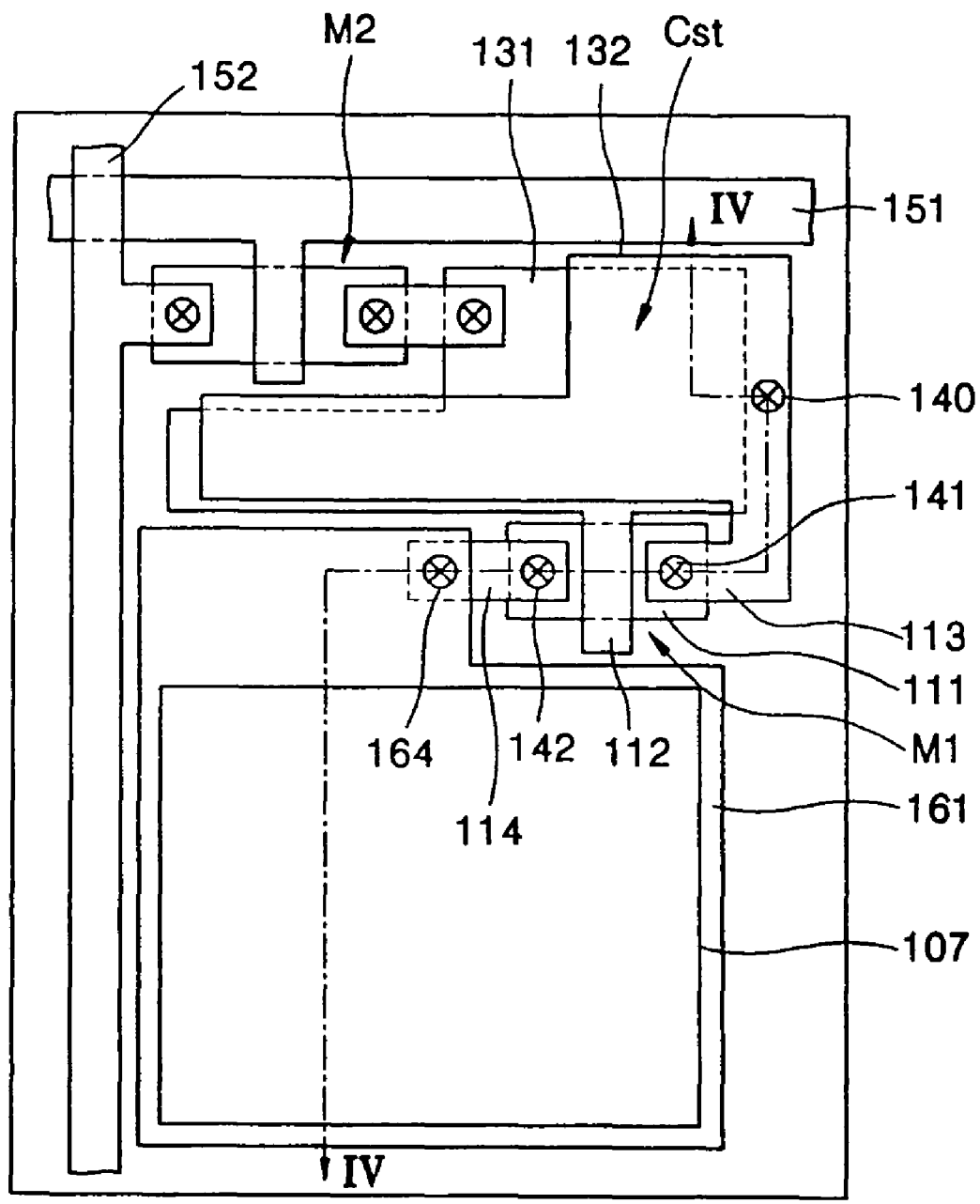
FIG. 9 is a plan view of a layout of a pixel structure to realize the circuit of FIG. 3 according to another embodiment of the present invention.
Figure 10:
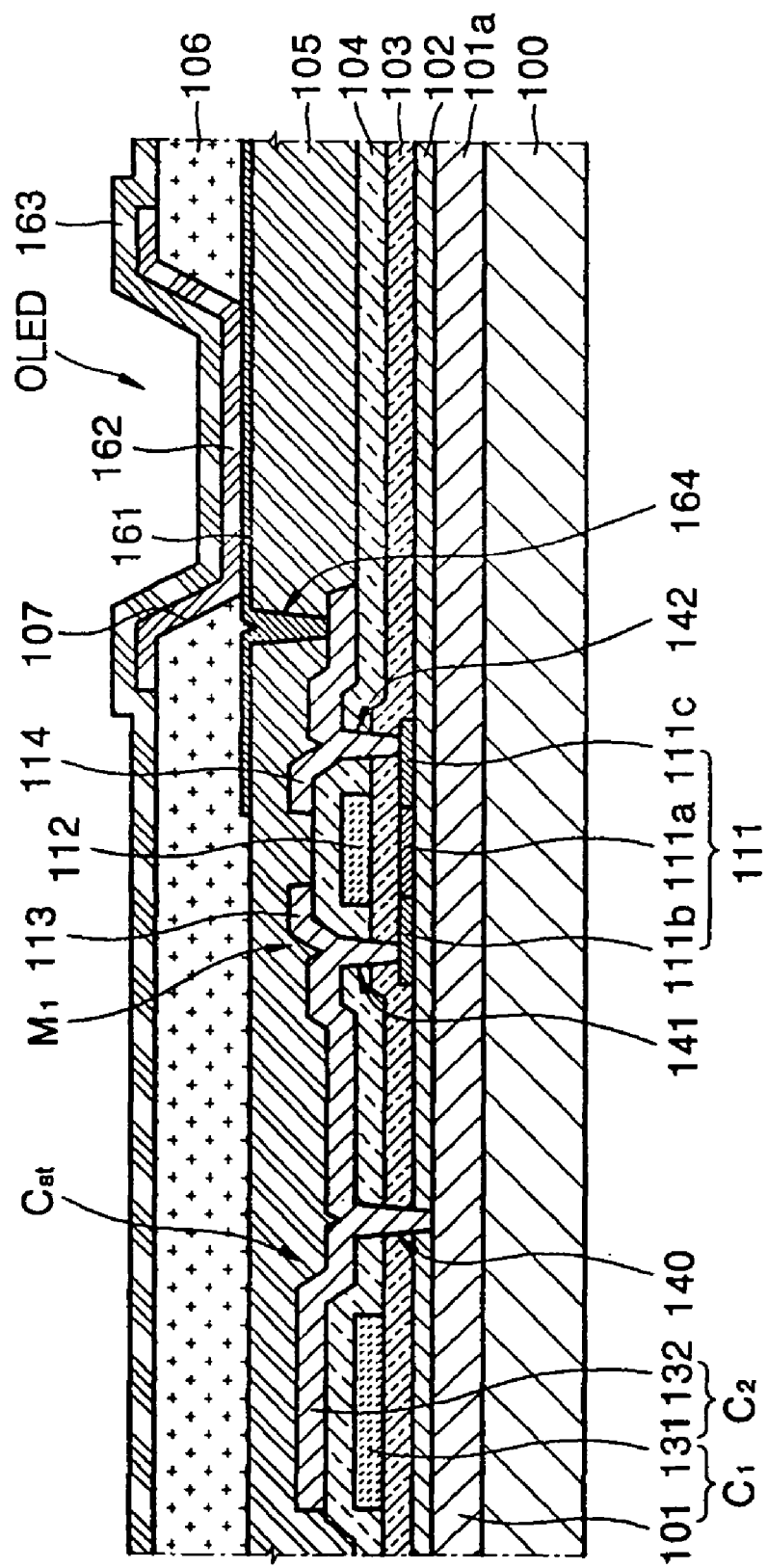
FIG. 10 is a cross-sectional view taken along a line IV-IV of FIG. 9.

FIG. 9 is a plan view of a pixel of an OLED according to another embodiment of the to present invention, and FIG. 10 is a cross-sectional view taken along a line IV-IV of FIG. 9.

The pixel of an OLED in FIGS. 9 and 10 does not include an additional Vdd line like the pixel of an OLED of FIGS. 7 and 8, and a first pattern unit 101a functions as the Vdd line.

Also, the drain electrode of a switching TFT M2 is connected to a first electrode 131 of a capacitor unit Cst, and the first electrode 131 of the capacitor unit Cst is formed in one body with a gate electrode 112 of a driving TFT M1.

As depicted in FIGS. 9 and 10, a second electrode 132 of the capacitor unit Cst is electrically connected to the first pattern unit 101a, to which the Vdd power is supplied, via a first through hole 140. Also, the second electrode 132 and a source electrode 113 of the driving TFT M1 are formed in one body.

Other structures of FIGS. 9 and 10 are the same as those of FIGS. 7 and 8, and thus, detailed descriptions thereof have been omitted.

According to the current embodiment of the present invention, the voltage drop of the capacitor unit Cst can be prevented since the second electrode 132 of the capacitor unit Cst, formed at the same time as the source and drain electrodes 113 and 114, is electrically connected to the first pattern unit 101a, and also, the voltage drop of the Vdd power line can be prevented since the Vdd line that supplies a Vdd power does not pass the pixels.

Figure 11:
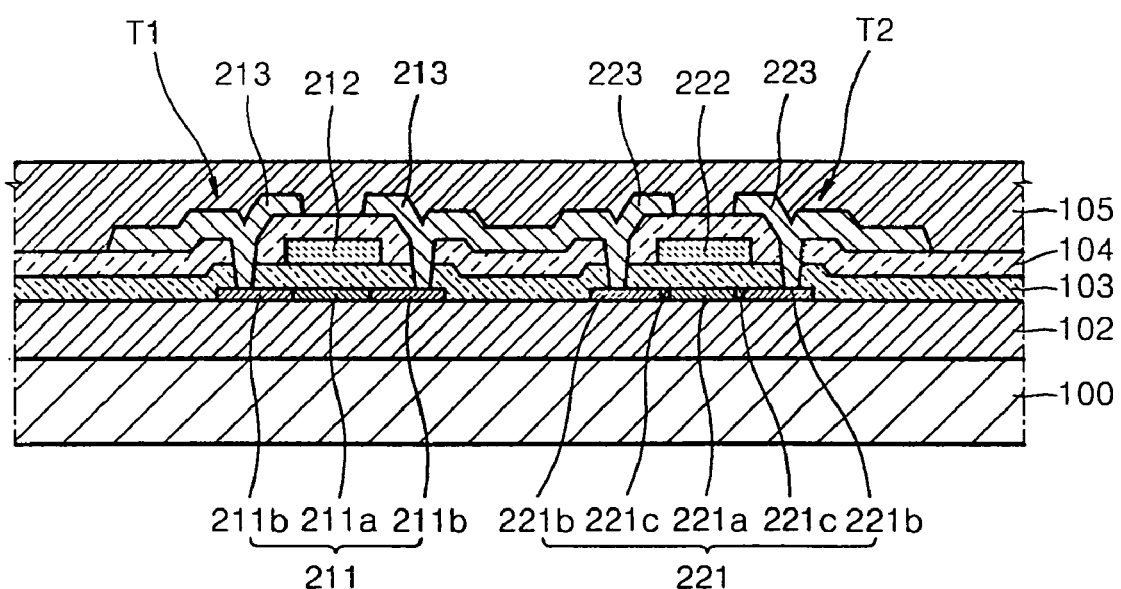
FIG. 11 is a cross-sectional view of a Complementary Metal Oxide Semiconductor (CMOS) device in a circuit region of FIG. 3 according to an embodiment of the present invention.

FIG. 11 is a cross-sectional view of a CMOS device CM in the circuit region C of FIG. 3 according to an embodiment of the present invention. Referring to FIG. 11, the CMOS device CM located in the circuit region C is formed in a region where the first pattern unit 101a is not formed.

That is, as depicted in FIG. 11, an insulating film 102 is formed on a substrate 100, and a P type TFT T1 and an N type TFT-T2 are formed on the insulating film 102. Each of the P type TFT T1 and the N type TFT T2 can be formed at the same time as the driving TFT M1.

The P type TFT T1 includes a semiconductor active layer 211 having source and drain regions 211b and a channel region 211a, a gate electrode 212 insulated from the semiconductor active layer 211, and source and drain electrodes 213 contacting the source and drain regions 211b of the semiconductor active layer 211.

The N type TFT T2 includes a semiconductor active layer 221 having source and drain regions 221b and a channel region 221a, a gate electrode 222 insulated from the semiconductor active layer 221, and source and drain electrodes 223 contacting the source and drain regions 221b of the semiconductor active layer 221. LDD regions 221c are located between the source and drain regions 221b and the channel region 221a.

The CMOS devices CM can perform without interruption with a conductive film that supplies a Vdd power since the CMOS devices do not have the conductive film thereunder.

When the substrate 100 is a conductive substrate, the effect of the conductive substrate can be minimized when a Vdd power is supplied to the substrate 100 by forming the insulating film 102 thicker than the pixel region P.

Figure 12:
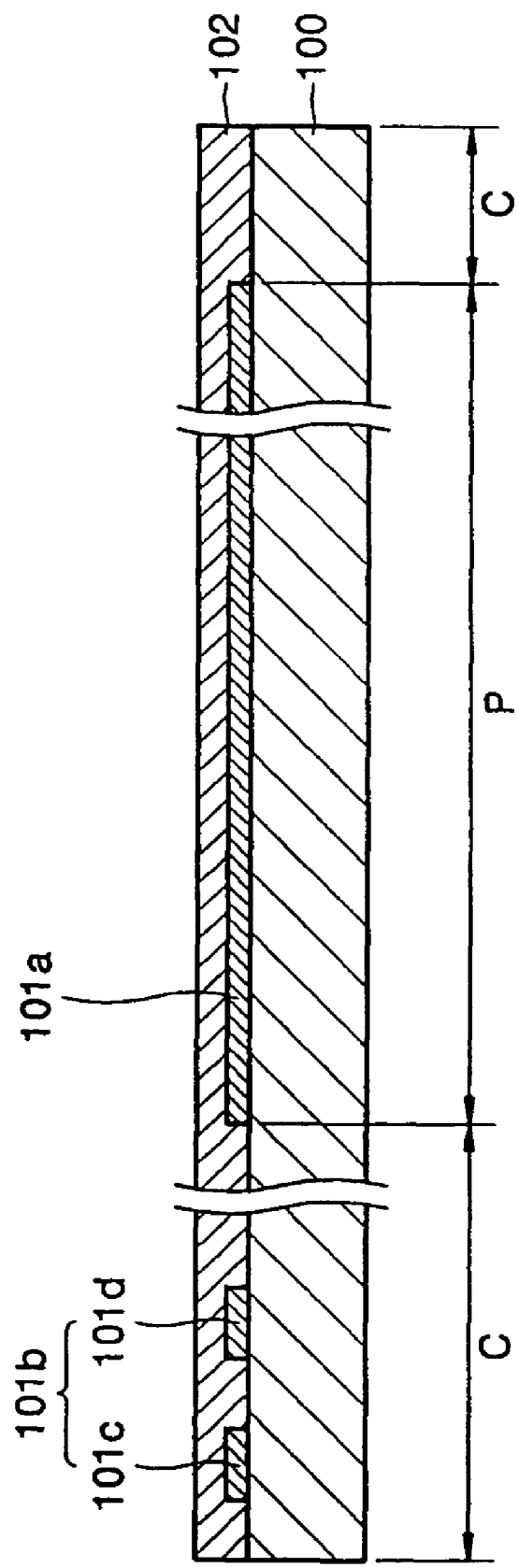
FIG. 12 is a cross-sectional view of another substrate with respect to the cross-sectional view taken along line I-I of FIG. 1 according to another embodiment of the present invention.

The pixel region P and the circuit region C according to the present invention can be realized as depicted in FIG. 12. FIG. 12 is a cross-sectional view of another substrate with respect to the cross-sectional view taken along line I-I of FIG. 1 according to another embodiment of the present invention.

Referring to FIG. 12, a second pattern unit 101b is formed besides the first pattern unit 101a, and an insulating film 102 covering the first pattern unit 101a and the second pattern unit 101b is formed on the substrate 100.

The second pattern unit 101b can be formed of any conductive material like the first pattern unit 101a, for example, a metal such as Al, Mo, Ag, Mg, W, Fe, Cr, Ni, Mn, etc.

Figure 13:
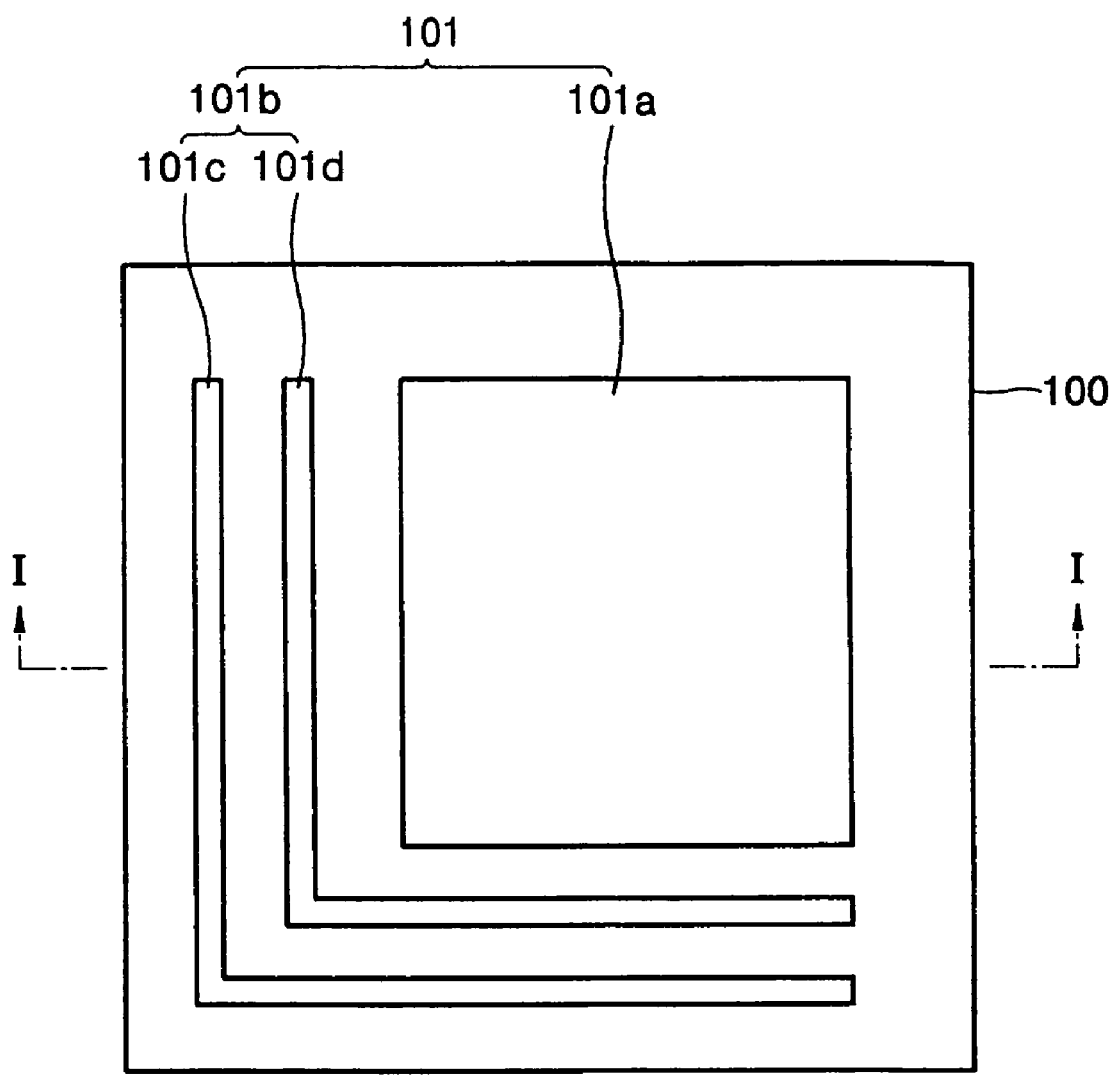
FIG. 13 is a plan view of patterns units of FIG. 12 according to an embodiment of the present invention.

As depicted in FIG. 12, the second pattern unit 101b located in a region corresponding to the circuit region C. FIG. 13 is a plan view of pattern units of FIG. 12 according to an embodiment of the present invention. As depicted in FIG. 13, the second pattern unit 101b can be patterned corresponding to electronic devices in the circuit region C. Like the example of the present invention, when a CMOS device is located in the circuit region C, a third pattern unit 101c and a fourth pattern unit 101d can be formed corresponding to active layers of a P type TFT T1 and an N type TFT T2 of the CMOS device.

Figure 14:
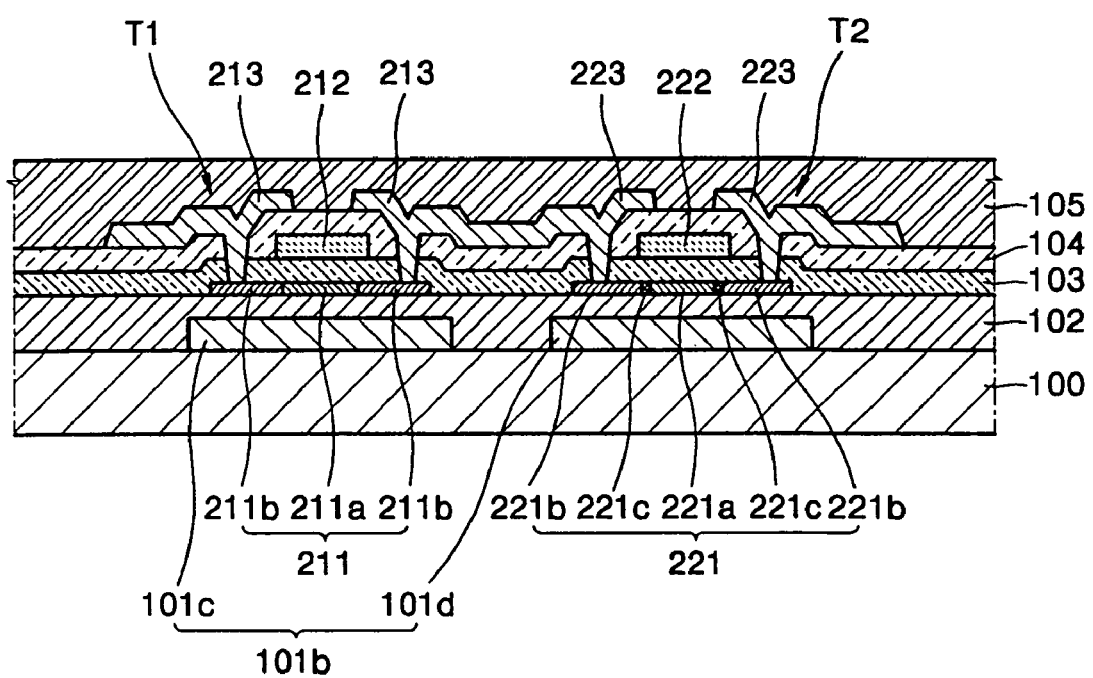
FIG. 14 is a cross-sectional view of a CMOS device in a circuit region of FIG. 3 according to another embodiment of the present invention.

FIG. 14 is a cross-sectional view of a CMOS device CM in the circuit region C of FIG. 3 according to another embodiment of the present invention. Referring to FIG. 14, the CMOS device CM located in the circuit region C is formed on the second pattern unit 101b.

That is, as depicted in FIG. 14, the third pattern unit 101c and the fourth pattern unit 101d are respectively formed on a substrate 100, and after an insulating film 102 covering the third pattern unit 101c and the fourth pattern unit 101d is formed, a P type TFT T1 and an N type TFT T2 are formed on the insulating film 102. The P type TFT T1 and the N type TFT T2 can be formed together with a driving TFT M1.

The P type TFT T1 includes a semiconductor active layer 211 having source and drain regions 211b and a channel region 211a, a gate electrode 212 insulated from the semiconductor active layer 211, and source and drain electrodes 213 contacted the source and drain regions 211b of the semiconductor active layer 211.

The N type TFT T2 includes a semiconductor active layer 221 having source and drain regions 221b and a channel region 221a, a gate electrode 222 insulated from the semiconductor active layer 221, and source and drain electrodes 223 contacted the source and drain regions 221b of the semiconductor active layer 221. LDD regions 221c are located between the source and drain regions 221b and the channel region 221a.

In the CMOS device CM, a positive voltage is supplied to the third pattern unit 101c located under the P type TFT T1, and a negative voltage is supplied to the fourth pattern unit 101d located under the N type TFT T2 so that the third pattern unit 101c and the fourth pattern unit 101d respectively act as back gates. Although not depicted, the third pattern unit 101c is connected to the Vdd power line so that a positive Vdd voltage is supplied thereto, and the fourth pattern unit 101d is electrically connected to a cathode power source, which is another driving power source of an OLED, so that a negative voltage is supplied thereto.

In the circuit region C, the second pattern unit 101b is not limited thereto, but can be formed in various ways according to electronic devices located in the circuit region C. For example, when a PMOS TFT or an NMOS TFT exists in the circuit region C besides the CMOS device, an additional conductive pattern matching the TFT is formed, and a corresponding positive or negative voltage is supplied to the conductive pattern so that the conductive pattern can perform as a back gate.

In the present invention, the characteristics of electronic devices in the circuit region C can further be improved by forming conductive patterns performing as back gates in the circuit region C.

The flat panel display according to the present invention can provide the following advantages.

The voltage drop of a Vdd line caused by resistance of the Vdd line can be prevented, and at the same time, electronic devices in a circuit region can be prevented from reducing characteristics caused by a conductive film to which a Vdd power is supplied in the circuit region.

The voltage drop of a capacitor can be prevented since an electrode of a capacitor unit acts as a conductive film.

In the circuit region, the characteristics of the electronic devices can further be improved by forming conductive patterns corresponding to the electronic devices and corresponding voltages are supplied to the conductive patterns so that the conductive patterns can perform as back gates.

While the present invention has been particularly shown and described with reference to exemplary embodiments thereof, it will be understood by those of ordinary skill in the art that various modifications in form and detail can be made therein without departing from the spirit and scope of the present invention as defined by the following claims.

What is claimed is:

1. A flat panel display, comprising:
    a substrate;
    an insulating film arranged on the substrate;
    a display region including a plurality of pixels, the display region being arranged on the insulating film and adapted to display an image;
    a circuit region arranged on the insulating film and including electronic devices adapted to control signals supplied to the display region, the circuit region being arranged on edges of the display region;
    a first conductive film having a first pattern interposed between the substrate and the insulating film only in all regions corresponding to the display region, the first conductive film being absent from regions corresponding to the circuit region; and
    a second conductive film having a second pattern interposed between the substrate and the insulating film only in a region corresponding to the circuit region, the second conductive film being absent from all regions corresponding to the display region;
    wherein each of the plurality of pixels includes a light emitting diode having a pixel electrode, and a Thin Film Transistor (TFT) electrically connected to the pixel electrode, the pixel electrodes being separated from each other and the first conductive film being electrically connected to the TFTs of all of the pixels, and each light emitting diode and TFT being arranged outside of the first conductive film.

2. The flat panel display of claim 1, wherein the display region comprises a plurality of pixel circuits electrically connected respectively to the plurality of light emitting diodes and to the first conductive film.

3. The flat panel display of claim 2, wherein each pixel circuit comprises a driving Thin Film Transistor (TFT) electrically connected to a respective light emitting diode and to the first conductive film.

4. The flat panel display of claim 2, wherein each pixel circuit comprises a capacitor unit electrically connected to a respective light emitting diode, and wherein the first conductive film is electrically connected to at least one electrode of the capacitor unit.

5. The flat panel display of claim 4, wherein the capacitor unit comprises at least two capacitors connected in parallel to each other, and wherein the first conductive film comprises an electrode of one of the at least two capacitors.

6. The flat panel display of claim 2, wherein the display region comprises a data line, a scan line, and a driving power line electrically connected to the plurality of pixel circuits, and wherein the first conductive film is electrically connected to the driving power line.

7. The flat panel display of claim 2, wherein the display region comprises a data line and a scan line electrically connected to the plurality of pixel circuits, and wherein a driving power supply is connected to the first conductive film connected to the plurality of pixel circuits.

8. The flat panel display of claim 1, wherein the circuit region comprises at least one Thin Film Transistor (TFT) arranged on the insulating film, and wherein the second conductive film is arranged at least in a region corresponding to a channel region of the at least one TFT.

9. The flat panel display of claim 8, wherein a voltage having an opposite polarity to a gate voltage supplied to the TFT corresponding to the second conductive film, is supplied to the second conductive film.

10. The flat panel display of claim 8, wherein the circuit region comprises a CMOS device including an N-type Metal Oxide Semiconductor (NMOS) TFT and a P-type Metal Oxide Semiconductor (PMOS) TFT arranged on the insulating film, and wherein the second conductive film comprises a third conductive film arranged to correspond to at least a channel region of the NMOS TFT and a fourth conductive film arranged to correspond to at least a channel region of the PMOS TFT.

11. The flat panel display of claim 10, wherein a first terminal enabling a negative voltage is supplied to the third conductive film and a second terminal enabling a positive voltage is supplied to the fourth conductive film.

12. The flat panel display of claim 11, wherein the voltage supplied to the third conductive film is supplied from a driving power source adapted to drive the light emitting diode.

13. The flat panel display of claim 11, comprising a driving power source adapted to drive the light emitting diode by supplying the positive voltage to the fourth conductive film.

* * * * *